United States Patent [19]
Knowles et al.

[11] Patent Number: 5,991,324
[45] Date of Patent: Nov. 23, 1999

[54] RELIABLE, MODULAR, PRODUCTION QUALITY NARROW-BAND KRF EXCIMER LASER

[75] Inventors: David S. Knowles; James H. Azzola; Herve A. Besaucele, all of San Diego; Palash P. Das, Vista; Alexander I. Ershov; Igor V. Fomenkov, both of San Diego; Tibor Juhasz, Irvine; Robert G. Ozarski, Poway; William N. Partlo; Daniel A. Rothweil, both of San Diego; Richard L. Sandstrom, Encinitas; Richard C. Ujazdowski, San Diego; Tom A. Watson, Carlsbad; Richard M. Ness, San Diego, all of Calif.

[73] Assignee: Cymer, Inc., San Diego, Calif.

[21] Appl. No.: 09/041,474

[22] Filed: Mar. 11, 1998

[51] Int. Cl.$^6$ ........................................................ H01S 3/22
[52] U.S. Cl. ........................ 372/57; 372/20; 372/100; 372/102; 372/98; 372/38; 372/25; 372/58
[58] Field of Search ............................. 372/57, 20, 86, 372/100, 19, 61, 55, 98, 102, 38, 25, 58

[56] References Cited

U.S. PATENT DOCUMENTS

| | | | |
|---|---|---|---|
| 4,618,960 | 10/1986 | Nazemi | 372/61 |
| 4,959,840 | 9/1990 | Akins et al. | 372/57 |
| 5,025,445 | 6/1991 | Anderson et al. | 372/20 |
| 5,029,177 | 7/1991 | Akins et al. | 372/57 |
| 5,033,055 | 7/1991 | Akins et al. | 372/57 |
| 5,033,056 | 7/1991 | Perzl | 372/57 |
| 5,260,961 | 11/1993 | Zhou et al. | 375/57 |
| 5,337,330 | 8/1994 | Larson | 372/86 |
| 5,377,215 | 12/1994 | Das et al. | 372/57 |
| 5,450,207 | 9/1995 | Fomenkov | 356/416 |
| 5,771,258 | 6/1998 | Morton et al. | 372/57 |
| 5,835,520 | 11/1998 | Das et al. | 372/57 |

Primary Examiner—Leon Scott, Jr.
Attorney, Agent, or Firm—John R. Ross, Esq.

[57] ABSTRACT

A reliable, modular, production quality narrow-band KrF excimer laser capable of producing 10 mJ laser pulses at 1000 Hz with a bandwidth of about 0.6 pm or less. The present invention is especially suited to long-term round-the-clock operation in the lithographic production of integrated circuits. Improvements over prior art lasers include a single upstream preionizer tube and acoustic baffles. A preferred embodiment includes reduced fluorine concentration, an anode support bar shaped to reduce aerodynamic reaction forces on blower bearings, a modified pulse power system providing faster pulse rise time, an output coupler with substantially increased reflectivity, a line narrowing module with CaF prism beam expanders, a more accurate wavemeter, a laser computer controller programmed with new and improved pulse energy control algorithm.

16 Claims, 16 Drawing Sheets

PDA OUTPUT SHOWING ETALON FRINGES

RELIABLE. MODULAR, PRODUCTION QUALITY NARROW-BAND KRF EXCIMER LASER

This Application is a Continuation-In-Part of U.S. Ser. No. 09/034,870, Pulse Energy Control for Excimer Laser, filed Mar. 04, 1998 (97-0006-03); U.S. Ser. No. 08/995,832, Excimer Laser Having Pulse Power Supply with Fine Digital Regulation, filed Dec. 22, 1997; U.S. Ser. No. 08/842, 305, Very Narrow-band KrF Laser, filed Apr. 23, 1997; and U.S. Ser. No. 08/625,500, Low Cost Corona Preionizer for a Laser, filed Mar. 29, 1996; all of which are incorporated herein by reference. This invention relates to lasers and in particular to narrow-band KrF excimer lasers.

BACKGROUND OF THE INVENTION

KrF excimer lasers are currently becoming the workhorse light source for the integrated circuit lithography industry. A typical prior-art KrF excimer laser in the production used integrated circuits is depicted in FIG. 1 and FIG. 2. A cross section of the laser chamber of this prior art laser is shown in FIG. 3. A pulse power module 2 powered by high voltage power supply 3 provides electrical pulses to electrodes 6 located in a discharge chamber 8. The electrodes are about 28 inches long and are spaced apart about ⅗ inch. Typical lithography lasers operated at a high pulse rate of about 1000 Hz. For this reason it is necessary to circulate a laser gas (about 0.1% fluorine, 1.3% krypton and the rest neon which functions as a buffer gas) through the space between the electrodes. This is done with tangential blower 10 located in the laser discharge chamber. The laser gases are cooled with a heat exchanger 11 also located in the chamber and a cold plate 13 mounted on the outside of the chamber. Cooling water for cold plate 13 and heat exchanger 11 enters at water inlet 40 and exits at water outlet 42 as shown in FIG. 3. The natural bandwidth of the KrF laser is narrowed by line narrowing module 18. Commercial excimer laser systems are typically comprised of several modules that may be replaced quickly without disturbing the rest of the system. Principal modules are shown in FIG. 2 and include:

Laser Chamber 8,
Pulse Power Module 2,
Output coupler 16,
Line Narrowing Module 18
Wavemeter 20
Computer Control Unit 22

These modules are designed for quick replacement as individual units to minimize down time to the laser when maintenance is performed. Electrodes 6 consist of cathode 6A and anode 6B. Anode 6B is supported in this prior art embodiment by anode support bar 44 which is about 28 inches long and is shown in cross section in FIG. 3. Flow is clockwise in this view. One corner and one edge of anode support bar 44 serves as a guide vane to force air from blower 10 to flow between electrodes 6A and 6B. Other guide vanes in this prior art laser are shown at 46, 48 and 50. Perforated current return plate 52 helps ground anode 6B to chamber 8. The plate is perforated with large holes (not shown in FIG. 3) located in the laser gas flow path so that the plate does not substantially affect the gas flow. Electrode discharge capacitors 54 are charged prior to each pulse by pulse power module 2. During the voltage buildup on capacitor 54 a high electric field is created by two preionizers 56 which produce an ion field between electrodes 6A and 6B and as the charge on capacitors reach about 16,000 volts, a discharge across the electrode is generated producing the excimer laser pulse. Following each pulse, the gas flow created by blower 10 is sufficient to provide fresh laser gas between the electrodes in time for the next pulse occurring 1.0 milliseconds later.

The discharge chamber is operated at a pressure of about three atmospheres. These lasers operate in a pulse mode at high repetition rates such as 1000 Hz. The energy per pulse is about 10 mJ.

At wavelengths below 300 nm there are few optical materials available for building the stepper lens used for chip lithography. The most common material is fused silica. An all fused silica stepper lens will have no chromatic correction capability. The KrF excimer laser has a natural bandwidth of approximately 300 pm (full width half maximum). For a refractive lens system (with NA>0.5)— either a stepper or a scanner—this bandwidth needs to be reduced to below 1 pm to avoid chromatic aberrations. Prior art commercially-available laser systems can provide KrF laser beams at a nominal wavelength of about 248 nm with a bandwidth of about 0.8 pm (0.0008 nm). Wavelength stability on the best commercial lasers is about 0.25 pm. With these parameters stepper makers can provide stepper equipment to provide integrated circuit resolutions of about 0.3 microns.

Electric discharge lasers such as excimer lasers require high voltage power supplies. A prior art typical simplified electric circuit for an excimer laser is shown in FIG. 4. The electric circuit includes a magnetic switch circuit and a power supply for the magnetic switch circuit. Blocks representing a 1 kV prior-art power supply for the laser are shown at 3 in FIG. 2 and FIG. 4. A more detailed description of the prior art power supply is shown in FIG. 5A. In the typical prior art laser system, the power supply 2 provides high voltage pulses of about 600 volts lasting about 0.2 milliseconds at frequencies such as 1000 Hz. The magnetic switch circuit shown in FIG. 4 compresses and amplifies these pulses to produce electrical discharges across the electrodes of the laser as shown in FIG. 4. These discharge pulses across the electrodes are typically about 16,000 volts with duration of about 70 ns.

Maintaining constant power supply output voltage when the laser is operating continuously at a specific repetition rate, such as 1000 Hz, is a challenge for laser suppliers. This task is made much more difficult when the laser is operated in a burst mode. A typical burst mode is one in which the laser is required to produce bursts of about 110 pulses at a rate of 1000 kHz during the bursts with the bursts being separated by a "dead time" of a fraction of a second to a few seconds. When operating in a continuous mode, the output voltage variation, to maintain relatively constant output pulse energy, is in the range of about 0.6% (about 3 to 3.5 volts). When operating in the burst mode, the variation during the first few pulses (up to about 40 pulses) is about 2.5% (about 12 to 15 volts) and precise control of pulse energy variation is not as good.

In a typical lithography excimer laser, a feedback control system measures the output laser energy of each pulse, determines the degree of deviation from a desired pulse energy, and then sends a signal to a controller to adjust the power supply voltage so that energy of subsequent pulses are closer to desired energy. In prior art systems, this feedback signal is an analog signal and it is subject to noise produced by the laser environment. This noise can result in erroneous power supply voltages being provided and can in turn result in increased variation in the output laser pulse energy.

These excimer lasers are typically required to operate continuously 24 hours per day, 7 days per week for several months, with only short outages for scheduled maintenance.

One problem experienced with these prior-art lasers has been excessive wear and occasional failure of blower bearings.

The prior-art wavemeter module shown in FIG. 2 is described in FIG. 6. The wavemeter utilizes a grating for coarse measurement of wavelength and an etalon for fine wavelength measurement and contains an iron vapor absorption cell to provide an absolute calibration for the wavemeter. This prior art device focuses the coarse signal from the grating on a linear photo diode array in the center of a set of fringe rings produced by the etalon. The center fringes produced by the etalon are blocked to permit the photo diode array to detect the coarse grating signal. The prior-art wavemeter cannot meet desired accuracy requirements for wavelength measurements.

Prior-art lasers such as the one discussed above are very reliable, producing billions of pulses before the need for major maintenance, but integrated circuit fabricators are insisting on even better performance and reliability. Therefore, a need exists for a reliable, production quality excimer laser system, capable of long-term factory operation and having wavelength stability of less than 0.2 pm and a bandwidth of less than 0.6 pm.

SUMMARY OF THE INVENTION

The present invention provides a reliable, modular, production quality narrow-band KrF excimer laser capable of producing 10 mJ laser pulses at 1000 Hz with a bandwidth of about 0.6 pm or less.

The present invention is especially suited to long-term round-the-clock operation in the lithographic production of integrated circuits. Improvements over prior art lasers include a single upstream preionizer tube and acoustic baffles. A preferred embodiment includes reduced fluorine concentration, an anode support bar shaped to reduce aerodynamic reaction forces on blower bearings, a modified pulse power system providing faster pulse rise time, an output coupler with substantially increased reflectivity, a line-narrowing module with CaF prism beam expanders, a more accurate wavemeter, a laser computer controller programmed with new and improved pulse energy control algorithm.

DETAILED DESCRIPTION OF PREFERRED EMBODIMENTS

Preferred Embodiment

A preferred embodiment of the present invention is an improved version of the laser described in FIGS. 1, 2, 3, 4, 5A. 5B. 5C, and 6. This preferred embodiment prior art includes the following improvements:

1) A single tube larger preionizer replaces the prior-art combination of a two-tube preionizer to provide improved efficiency, better preionization and improved laser gas flow between the electrodes;

2) Acoustic baffles are provided to minimize adverse effects of acoustic shock waves resulting from the electric discharges;

3) The prior art anode support bar has been modified to substantially reduce aerodynamic reaction forces on the blower bearings;

4) The fluorine concentration was reduced to improve pulse quality;

5) The solid-state pulse power system has been modified to produce faster rise time, providing more consistent pulses, and improved laser efficiency at higher voltages;

6) More precise control of the charging voltage of the pulse power system;

7) The reflectivity of the output coupler has been doubled to 20%, substantially decreasing the bandwidth of the output pulse;

8) Fused silica prisms have been replaced with CaF prisms to provide much better thermal stability;

9) An improved wavemeter providing much more precise measurement of nominal wavelength and bandwidth is provided; and 10) A computer controller programmed with a new algorithm providing a much improved control of pulse energy and burst energy.

Chamber Improvements

Single Preionizer Tube

Figure 3:
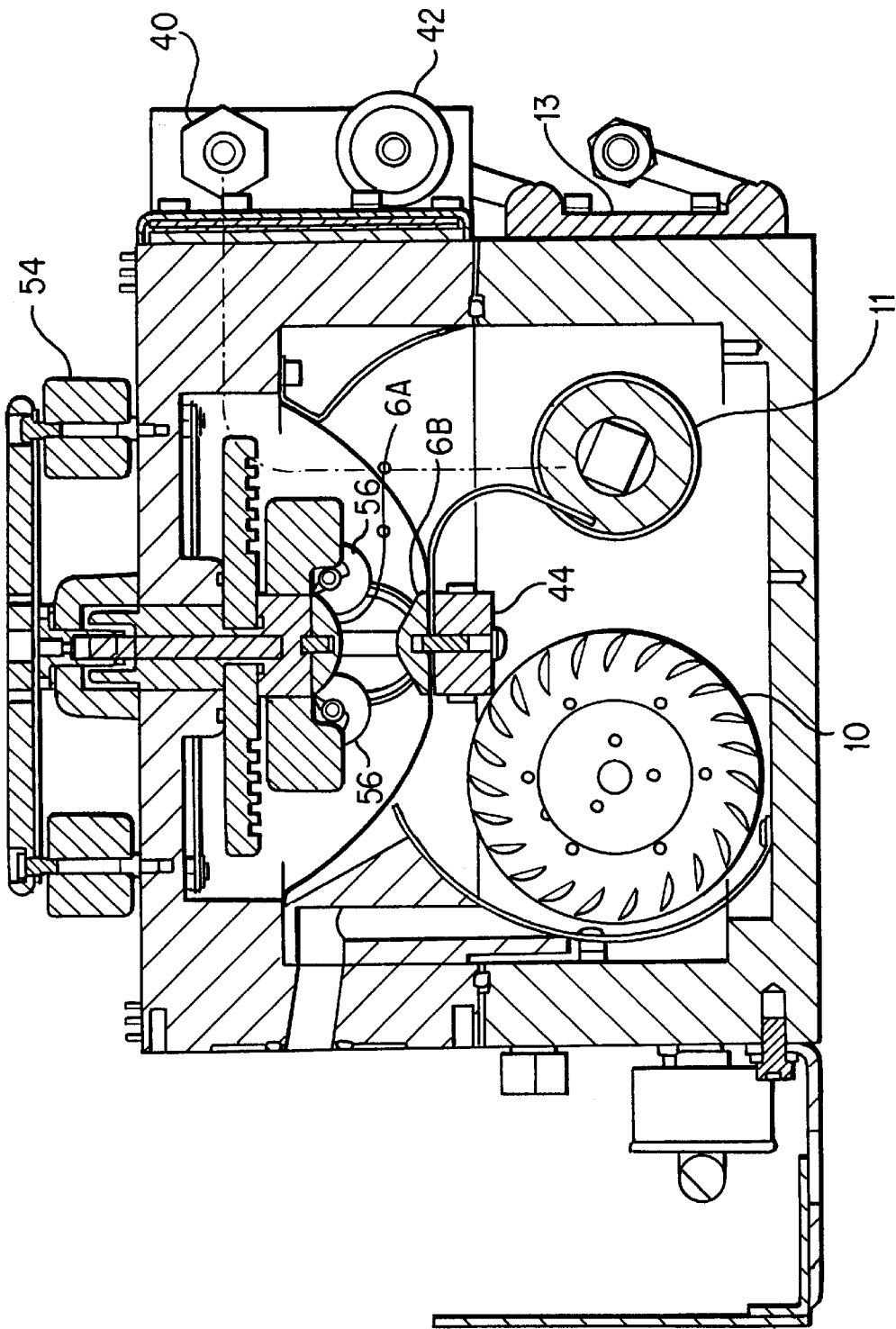
FIG. 3 is a drawing of the laser chamber of the FIG. 2 laser.
Figure 3A:
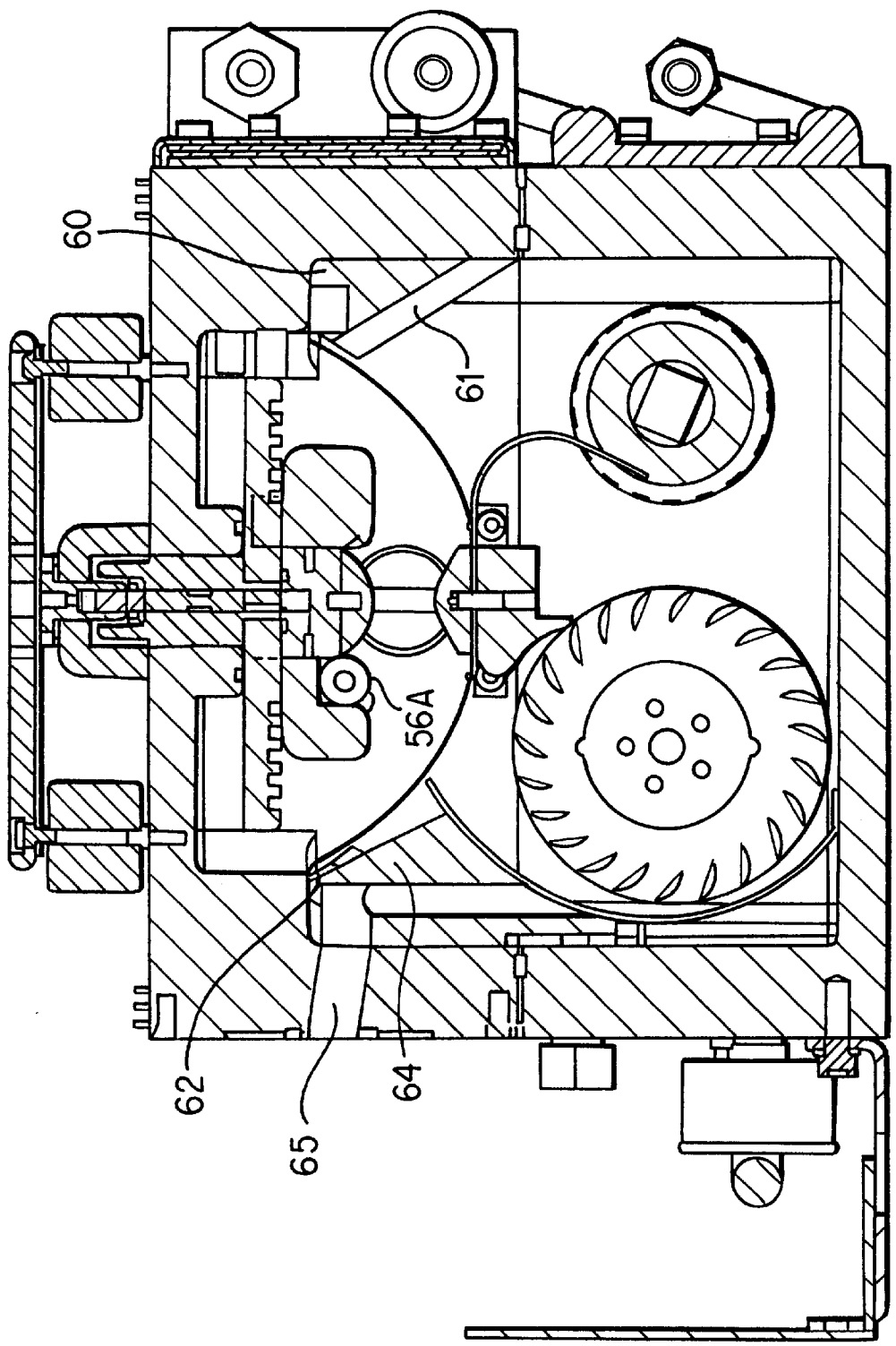
FIG. 3A is a drawing of a laser chamber showing features of a preferred embodiment of the present invention.
Figure 4:
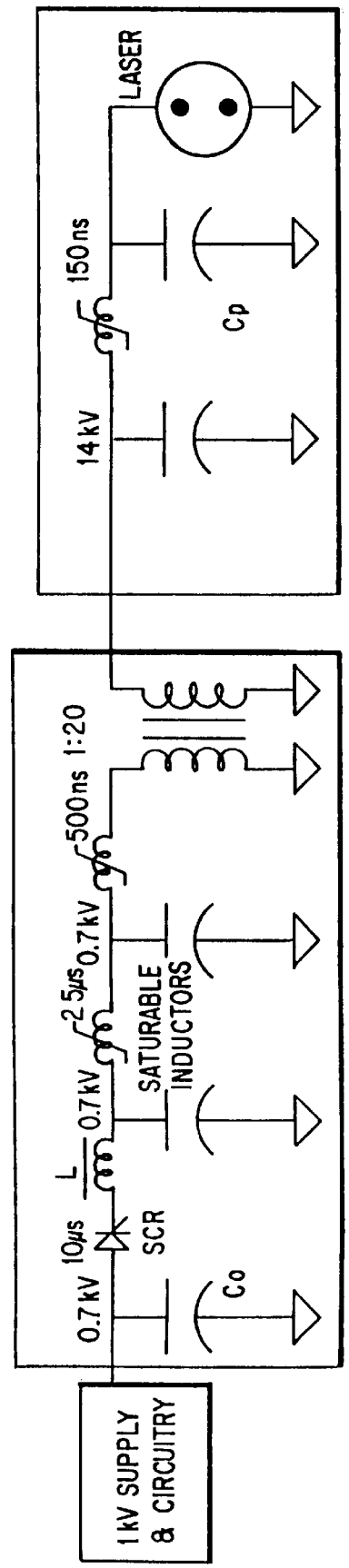
FIG. 4 is a simplified electrical drawing of a solid state pulse power circuit.

As shown in FIG. 3A, a single larger preionizer 56A tube has replaced the two preionizer tubes 56 shown in FIG. 3. The single tube preionizer is fabricated in accordance with the description in U.S. patent application Ser. No. 625,500, filed Mar. 29, 1996, which is incorporated herein by reference. Applicants have discovered that one preionizer tube is not only sufficient, but very surprisingly provides improved performance over the two preionizer design. In this embodiment the preionizer is located upstream of the electrodes. Applicants do not fully understand the reason for the improved performance. However, Applicants believe that the prior art downstream preionizers may attract and retard the removal of ions generated in one pulse long enough for those ions to interfere with the next pulse coming (in a kHz laser) about 1 millisecond later. Also, Applicants believe that the lack of symmetry associated with the one tube preionizer may be a reason for the observed improvement in the pulse-to-pulse stability.

Figure 7:
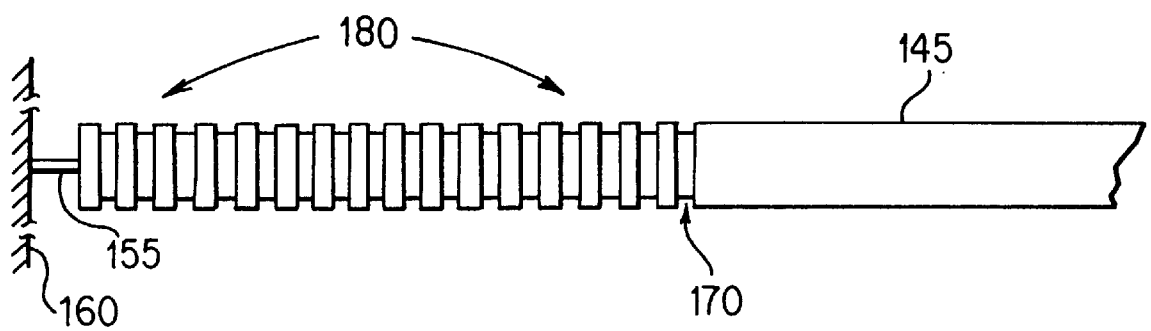
FIG. 7 is a drawing showing features of a preferred preionizer tube.

Referring now to FIG. 7, this preionizer utilizes an integrated tube design, having bushing element 180 with anti-tracking grooves 170 incorporated therein as a true integral component of the tube. Prior designs utilized a two-diameter design, necessitating, for manufacturing purposes, a bonding process to join the bushing component with the tube component. The constant diameter, thicker tube design is contrary to conventional design rules, which would predict a reduction in ionization due to lower capacitances. In most designs, the tube thickness is dependent upon the dielectric strength of the material selected. Those skilled in the art will recognize that optimum performance for a given tube geometry is conventionally determined by selecting a material with the highest dielectric strength and determining a wall thickness to match this capacity. For example, a sapphire material is known to have a dielectric strength ranging from 1200 volts/mil to 1700 volts/mil. Therefore, for tube 0.035 inches thick, there is a safety factor of 2 if the laser operates at 25 kV. In accordance with the present invention, a material of lesser dielectric strength is utilized in a single piece construction, necessitating a thicker tube wall. This design would theoretically yield a lower capacitance. The actual effect of this reduced capacitance on laser operation, however, was discovered to be negligible, with a surprising increase in the measured geometric irradiation of the electrode gap. Because of the constant diameter, thicker tube wall, integral bushing design, a single piece of material can be machined to provide anti-tracking grooves 170. Furthermore, because of the single piece construction, there is no need to use ultra-pure (i.e., 99.9%) polycrystalline translucent aluminum oxide ceramic; and there is no requirement to perform the difficult surface polishing of tube geometries in preparation for diffusion bonding to artificially create the integral relationship between bushing 180 and tube 145. In fact, it has been determined that high purity is not as important a property as porosity of the material. It has been found that the greater the porosity, the more the dielectric strength is reduced. As a result, a commercial grade ceramic, preferably with purity of at least 99.8% and low porosity, such as that manufactured by Coors Ceramics Company under the material no. AD-998E and having a dielectric strength of 300 volts/mil may be used. Bushings 180, having anti-tracking grooves 170 disposed therein, as previously described, act to prevent high voltage tracking axially along the surface of the tube from the cathode to the ground plane 160.

Acoustic Baffles

Applicants have discovered that a significant cause of distortion of the quality of laser beams produced by narrow-band 1000 $H_z$ KrF excimer lasers is acoustic shock waves created by the electric discharge of one pulse which reflects from elements of chamber structure back to the space between the electrodes and distorts the laser beam of the next pulse occurring 1.0 millisecond later in a 1000 $H_z$ laser. The embodiment described herein, FIG. 3A, substantially minimizes this effect by providing angled, grooved acoustic baffles 60 and 62 on both sides of the laser chamber. These baffles absorb a portion of the acoustic energy and reflect a portion of the acoustic energy down into the lower region of the laser chamber away from the electrodes. In this preferred embodiment, the baffles consist of a machined metal structure with grooves 0.1 mil wide, 0.3 mil deep spaced at 0.2 mil intervals; a 0.3 mil deep groove is shown at 61 in baffle 60 in FIG. 3A.

The reader should note that the baffle on the left side of the laser chamber, as shown in FIG. 3A, is substantially the same as the baffle shown on the right except that the baffle on the left is interrupted at the middle of the laser to accommodate the gas purification outlet port structure 64. The outlet port is shown as 65. This outlet port structure is located at the center of the laser chamber and thus appears prominent in the FIG. 3 center cross-section drawing of the chamber. These baffles have been shown by actual testing to substantially reduce pulse quality distortion caused by acoustic shock waves.

Anode Support Bar

As shown in FIG. 3, gas flow from blower 10 is forced to flow between electrodes 6A and 6B by anode support bar 44. However, Applicants have discovered that the prior art designs of support bar 44 such as that shown in FIG. 3 produced substantial aerodynamic reaction forces on the blower which were transferred to the blower bearings resulting in chamber vibration. Applicants suspect that these vibrational forces are responsible for blower bearing wear and possibly occasional bearing failures. Applicant has tested other designs, several of which are shown in FIGS. 12A–12E, all of which reduced the aerodynamic reaction forces by distributing over a longer time period, the reaction force resulting each time a blade passes close to the edge of support bar 44. Applicants preferred design as shown in FIG. 3A.

Lower $F_2$ Concentration

This embodiment of the present invention can operate at a wide range of fluorine concentration. In this preferred embodiment the preferred $F_2$ concentration is substantially lower than prior art KrF lasers in order to achieve improved laser pulse quality. Preferred methods of selecting the operating range is described in U.S. patent application Ser. No. 08/915,830 now U.S. Pat. No. 5,887,014 filed Aug. 20, 1997; which is incorporated herein by reference.

In preferred embodiments of the present invention which have been built and tested by Applicants, great care was taken to eliminate materials that consume fluorine from the discharge chamber. Fluorine consumption in a discharge chamber is due to fluorine reaction with materials in the chamber. These reactions typically produce contaminants, which result in deterioration of laser performance, requiring an increase in the fluorine concentration (or discharge voltage) to maintain desired output energy. In order to minimize fluorine consumption, this preferred embodiment includes the following specific features:

The chamber walls are aluminum coated with nickel.

The electrodes are brass.

All metal O-rings are used as seals.

Insulators are all ceramic and fluorine-compatible.

Alumina is Applicant's preferred insulator material.

An electrostatic filter is provided as in prior art designs to filter contaminants produced during operation.

The fan unit is driven using a magnetically-coupled motor located outside the sealed discharge chamber using a prior art technique.

During manufacture, parts are precision cleaned to remove potential contaminants.

After assembly, the chamber is passivated with fluorine.

This preferred embodiment requires substantial changes in operating procedures and parameters of the laser system in order to achieve the desired very narrow-band output. The fluorine concentration in reduced from 0.1% (30 kPa) to about 0.08% (24 kPa). The total gas pressure is about 300 kPa. (The Kr concentration is maintained at the prior art level of about 1.3% and the remainder of the laser gas is neon.) During operation, fluorine will be gradually depleted. Constant pulse energy is obtained by gradually increasing the laser operating voltage in accordance with prior art techniques. Injections of a mixture of fluorine (approximately 1.0% fluorine, 1% krypton and 98% neon), are made periodically (typically at intervals of about 1 to 4 hours) to make up for the depletion of fluorine in accordance with techniques well known in the excimer laser prior art. During this procedure, the fluorine concentration is preferably maintained within the range of between about 0.08% and 0.065% and the operating voltage is maintained within a corresponding range appropriate to maintain constant pulse energy. For example, in a preferred embodiment this range was 600 volts to 640 volts.

Pulsed Power Supply

Improvements

Figure 5A:
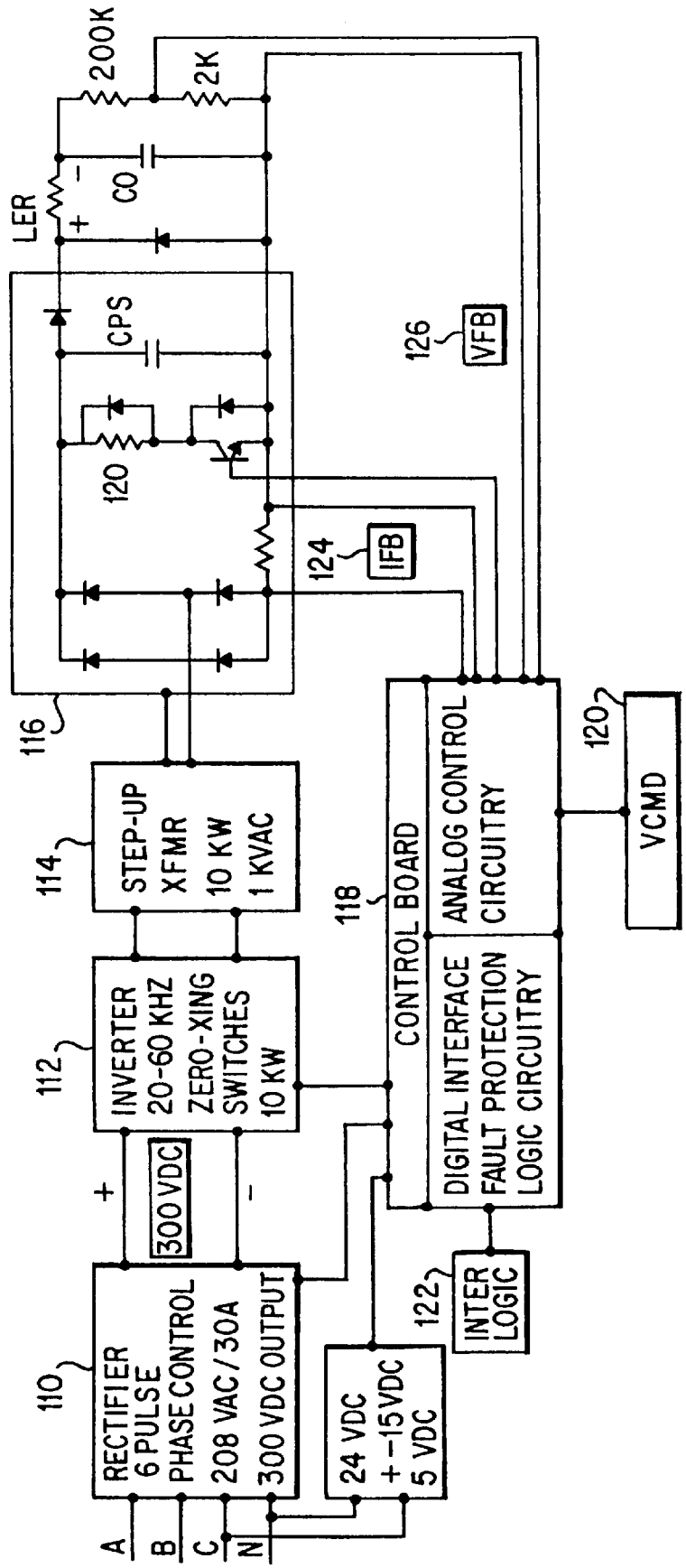
FIG. 5A is a circuit diagram of a typical prior art power supply.
Figure 5B:
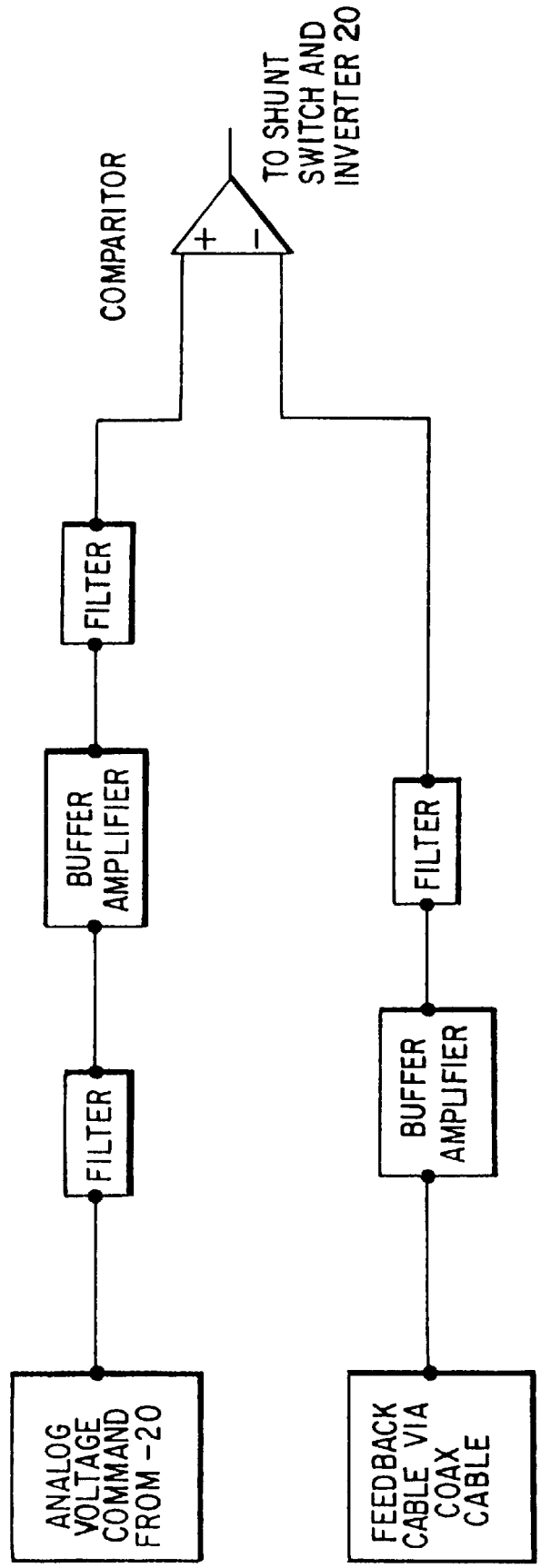
FIGS. 5B and 5C are circuit diagrams of prior art feedback circuits.
Figure 9:
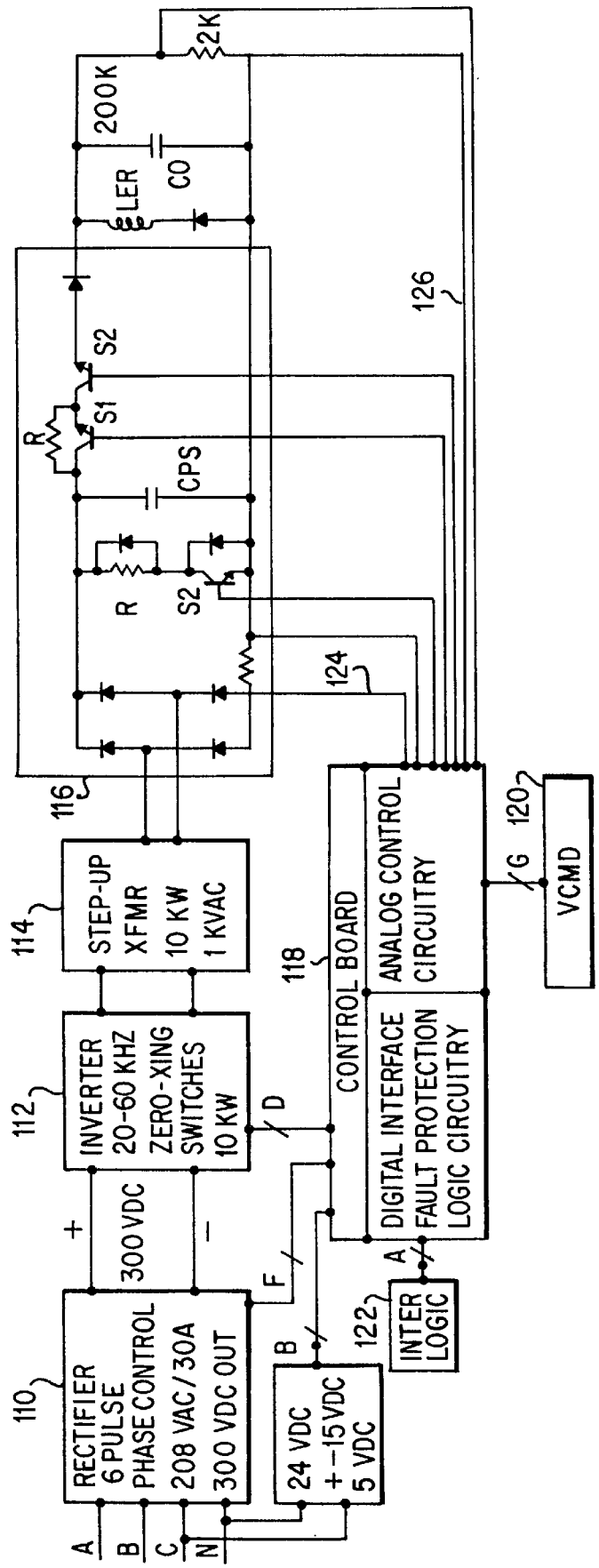
FIG. 9 is a circuit diagram showing features of a preferred embodiment of the present invention.

This embodiment includes an improved pulse power supply. FIG. 5A is a block diagram of a prior art power supply useful for providing high-frequency, high voltage pulses to power a current commercial lithography excimer laser. The principal components of the power supply are: a silicon controlled rectifier 110 powered at 208 VAC with an output up to 300 VDC, a zero crossing switched 10 kW inverter 112 which converts the DC voltage to an voltage at a frequency of 60 $kH_z$, a 10 kW step-up transformer 114 that steps up the voltage to 1000 VAC, and a 10 kW/1 kV output stage diode rectifier 116 with a shunt switch. A control board 118 provides the control of the power supply; control board 118 receives its instructions from an external control unit 120 which provides an analog signal from an operator and feedback control based on laser pulse energy. Analog input to control board 118 is also provided by voltage and current feedback signals as shown at 124 and 126 in FIG. 5A. An interface logic circuit 122 provides digital interface instructions, which may be provided by a control processor of a lithography stepper machine. As shown in FIG. 5A, control board 118 receives feedback voltage and current output signals from rectifier 116. These signals are used by control board 118 as feedback signals to control the power supply output. When Co has been charged to the desired level, the circuits of control board 118 interrupt the operation of inverter 112 as shown in FIG. 9 and fire the shunt switch S2 in rectifier 116 as shown in FIG. 9.

Circuit Changes

Figure 5C:
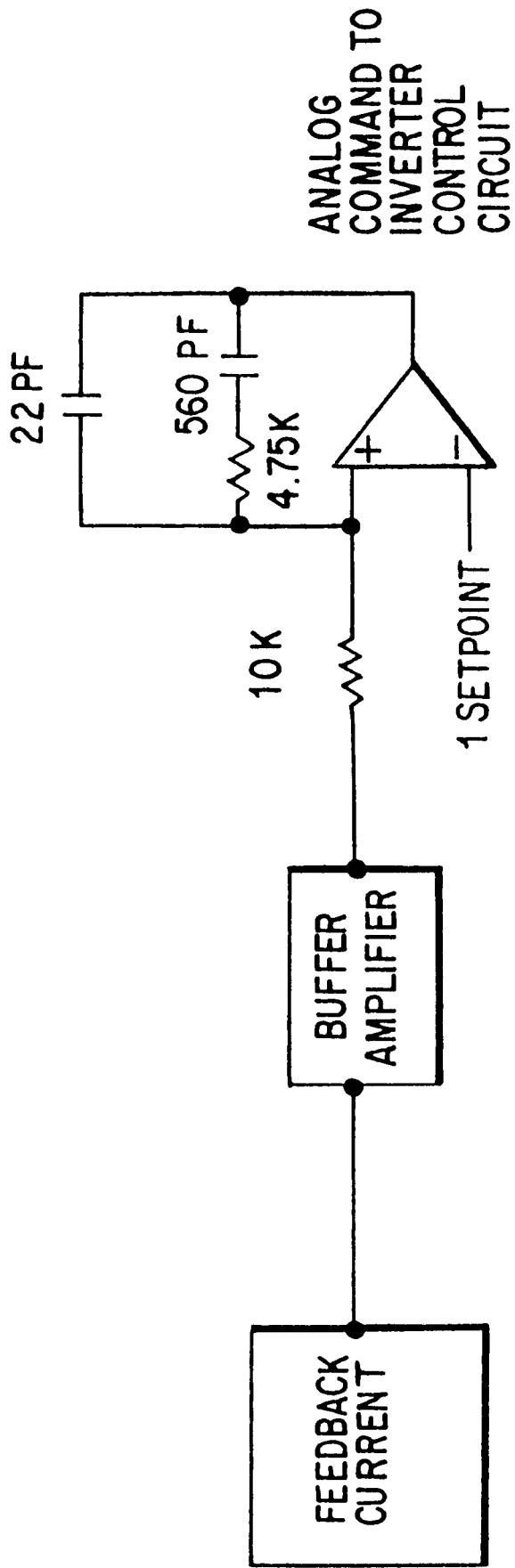

Applicants have discovered that a resonant frequency in the current feedback circuit was creating substantial voltage transients during burst operation of the prior art power supply units. To reduce these transients, Applicants changed two resistors in the current feedback control circuit as is shown by a comparison of FIG. 8B and prior art FIG. 5C. Specifically, the 10 k-ohm resistor was changed to 30 k ohms and the 4.75 k ohm resistor was changed to 100 ohms. These minor changes caused a very substantial reduction in the transient voltage variation during burst mode operation as will be discussed later.

Digital Command Control

Figure 8A:
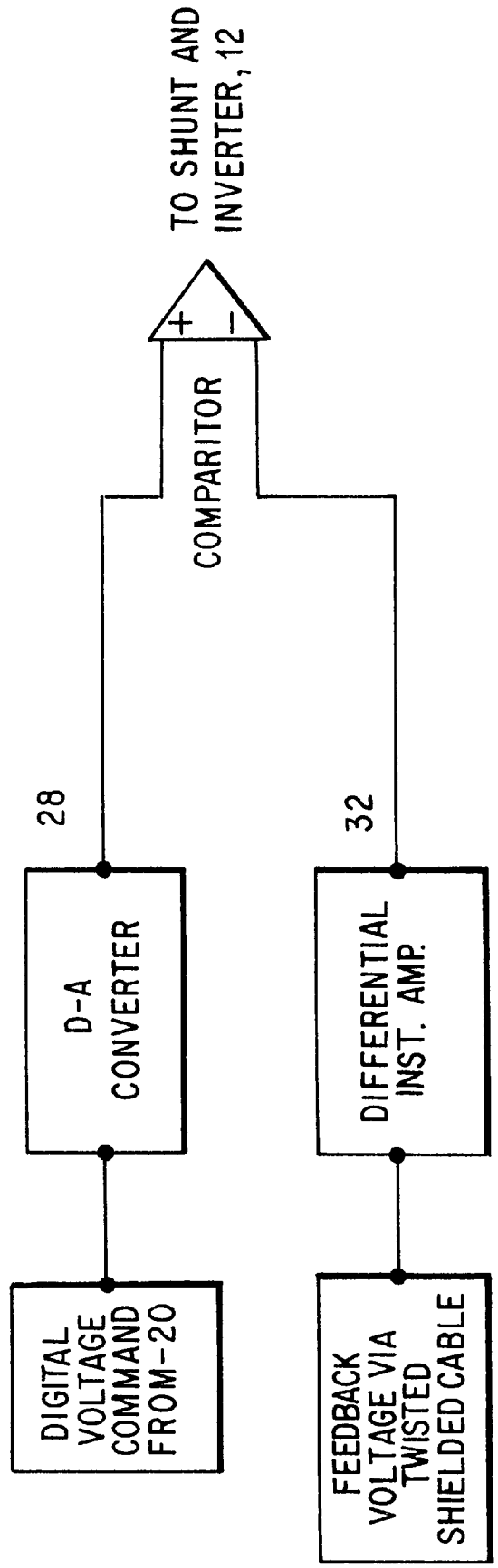
FIGS. 8A and 8B are diagrams of preferred feedback circuits.

Applicants discovered that the prior-art analog voltage command circuits were being degenerated by noise sources associated with the laser system. A solution to this problem was to convert the command control to a digital signal which is transmitted to the power supply unit where it is converted to an analog signal as shown in FIG. 8A by digital to analog converter 28 to operate diode rectifier 16 shunt switch S2 for fast control of the power supply electronics as shown in FIG. 9. In this preferred embodiment, the feedback voltage on Co is processed through a differential instrumentation amplifier 32 and is compared to the voltage control signal sent digitally from the voltage command unit 120 in order to derive a trip signal to operate the rectifier 116 shunt switch S2 and inhibit the operation of inverter 112. The command voltage is transmitted to the power supply in a 12 bit format which provides an accuracy of 0.025%. This change provided another major reduction in transient variations as will be discussed below.

Differential Instrumentation Amplifiers

Figure 8B:
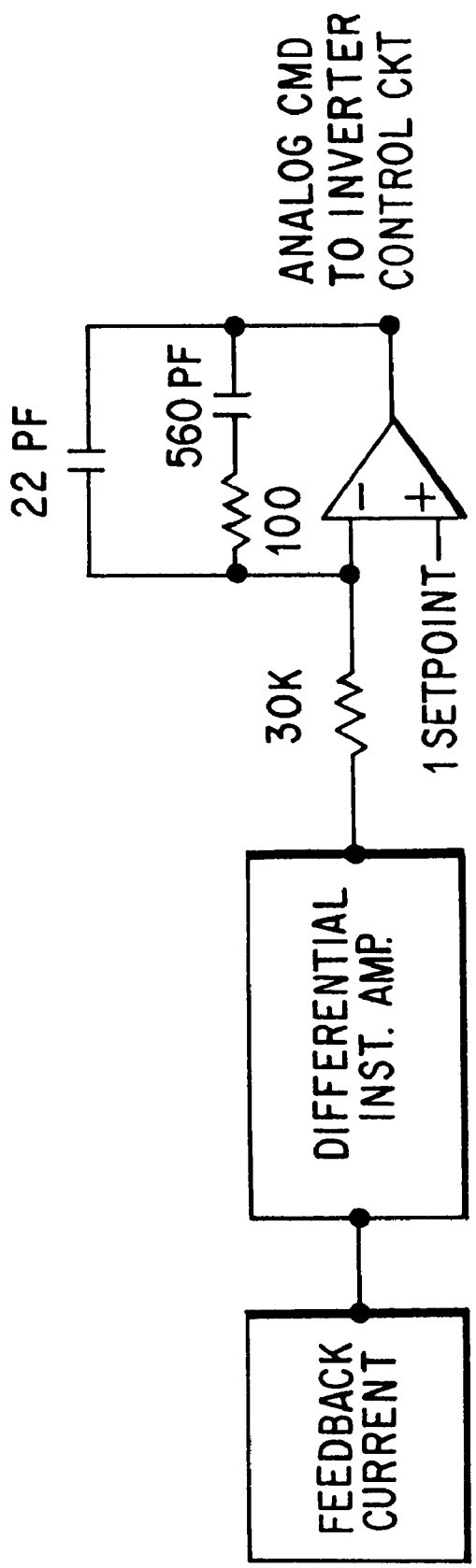

Other important improvements in this first preferred embodiment over the prior art power supplies are shown in FIGS. 8A and 8B. The simple buffer circuits of the prior art device have been replaced with differential instrumentation amplifiers. The feedback current signal is also processed through a differential instrumentation amplifier and is compared with a current set point as shown in FIG. 8B to provide an analog command signal to the inverter control circuit. This compactor circuit is a standard prior art compactor circuit used to create a desired "S" curve current flow during the charging cycle of the pulse (i.e., low current flow at the beginning and end and high current flow in the middle of the cycle).

Reduction of Charge Current Slope at End of Charge

The charge rate of Co is very fast, about 600 volts in about 500 microseconds. Therefore, for a constant charge rate, the timing of the firing of shunt switch S2 and the stopping of the operation of inverter 112 are extremely critical. To relax this timing requirement, Applicants have modified the power supply circuitry to reduce the effective frequency and amplitude of the current charging Co during the last approximately 5% of the charge cycle. To do this, Applicants added a resistor circuit in rectifier unit 116. A 20 ohm non-inductive resistor R* replaced the regular 20 ohm shunt resistor in rectifier 116. Also, a second 20 ohm non-inductive resistor R* is inserted into the circuit by the opening of switch S1 as shown in FIG. 9 during the last few inverter cycles of the charge cycle. This is accomplished by a control circuit (not shown) which is substantially the same as the one shown in FIG. 8A. This circuit also uses the converted command signal after it has been changed to analog and the $V_{fb}$ signal, but the command signal is attenuated by about 5% with a resistor divider circuit so that the extra resistance is added when the voltage is at about 95% of the command voltage. The resulting signal is used to open S1 a few microseconds prior to the voltage on Co reaching its desired value. These changes proved that the frequency of the current charging Co could be reduced by a factor of about 2 and the amplitude could be reduced by a factor of 3 to 4 during the last 5% of the charging cycle. The decrease in frequency and amplitude has produced a significant reduction of the charge current flow for the final few inverter cycles of the charge, and this permits a much more precise shut off of the charging cycle as compared to the prior art circuit.

Output Coupler

In this preferred embodiment of the present invention the reflectivity of the output coupler has been approximately doubled from about 10% which was typical of prior art narrow-band excimer lasers to about 20%. This was done to help make up for the loss of laser efficiency resulting from the reduced fluorine concentration, and to provide more feedback within the laser cavity to reduce the laser bandwidth.

Calcium Fluoride Prisms

The change in the reflectivity of the output coupler from 10% to 20% had the effect of approximately doubling the light passing through the line-narrowing module. The additional heat generated by this additional illumination in the prior art fused silica prisms caused thermal distortion in the prisms. To solve this problem the fused silica prisms were replaced with calcium fluoride prisms. Calcium fluoride has higher thermal conductivity and can handle the additional energy without unacceptable distortion.

Improved Wavemeter

Figure 6:
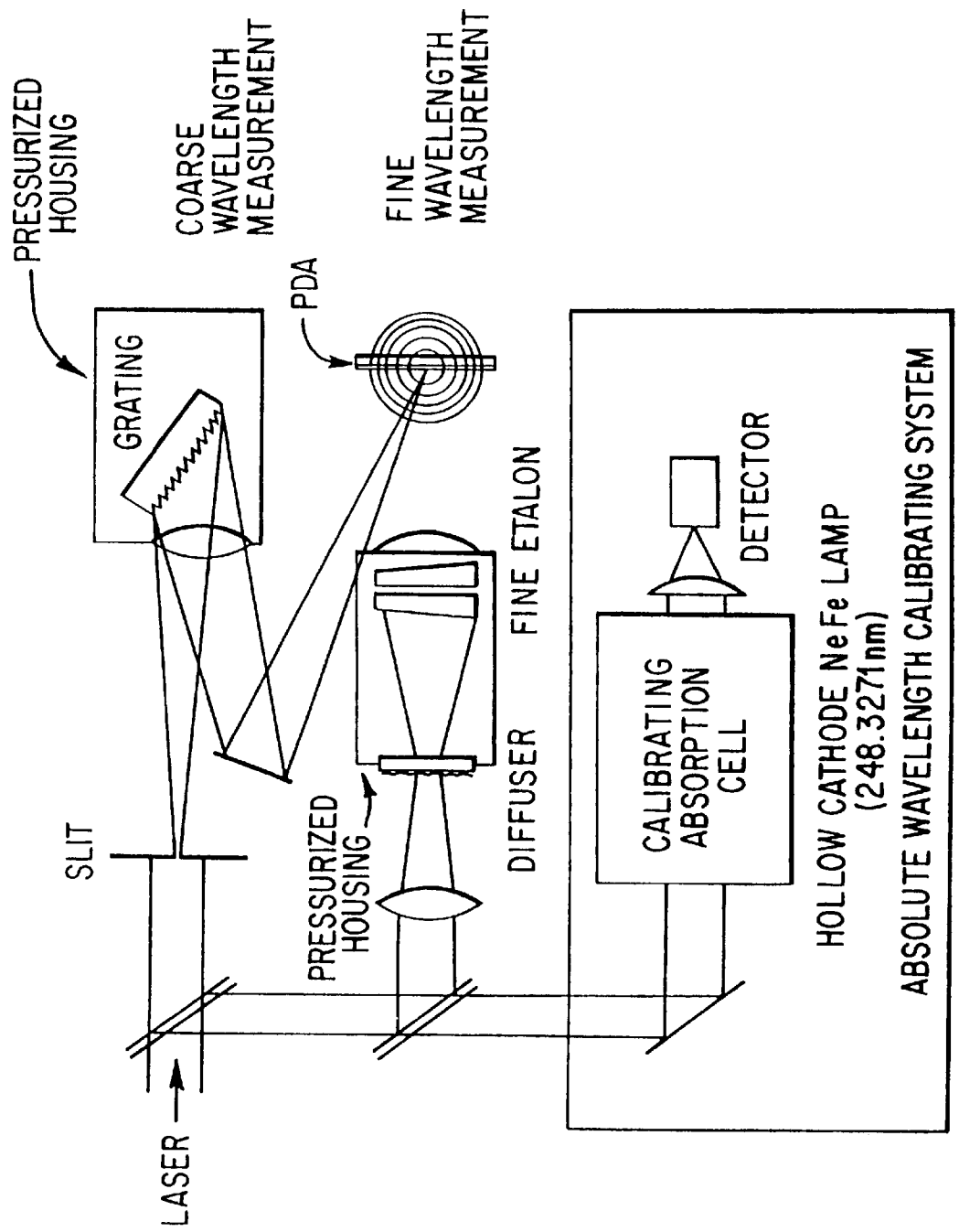
FIG. 6 is a drawing of a prior art wavemeter.

The present invention provides a major improvement in the wavelength quality in the precision of the nominal wavelength value, the stability of the wavelength, and the bandwidth. These improvements in beam quality have resulted in the need for a better wavemeter. Thus, a better wavemeter is included in this embodiment of the present invention. The wavemeter can he described by reference to FIG. 10. The wavemeter is similar to and may be compared with a prior art wavemeter shown in FIG. 6.

The output beam from the laser chamber intersects partially reflecting mirror 70, which passes about 95.5% of the beam energy and reflects about 4.5%.

About 4% of the reflected beam is reflected by mirror 71 to energy detector 72 which comprises a very fast photo diode 69 which is able to measure the energy of individual pulses occurring at the rate of 1000 per second. The pulse energy is about 10 mJ and the output of detector 72 is fed to computer controller 22 (FIG. 2) which uses a special algorithm (described below) to adjust the laser charging voltage to precisely control the pulse energy of future pulses based on stored pulse energy data in order to limit the variation of the energy of individual pulses and the integrated energy of bursts of pulses, all as described hereinafter.

Figure 10:
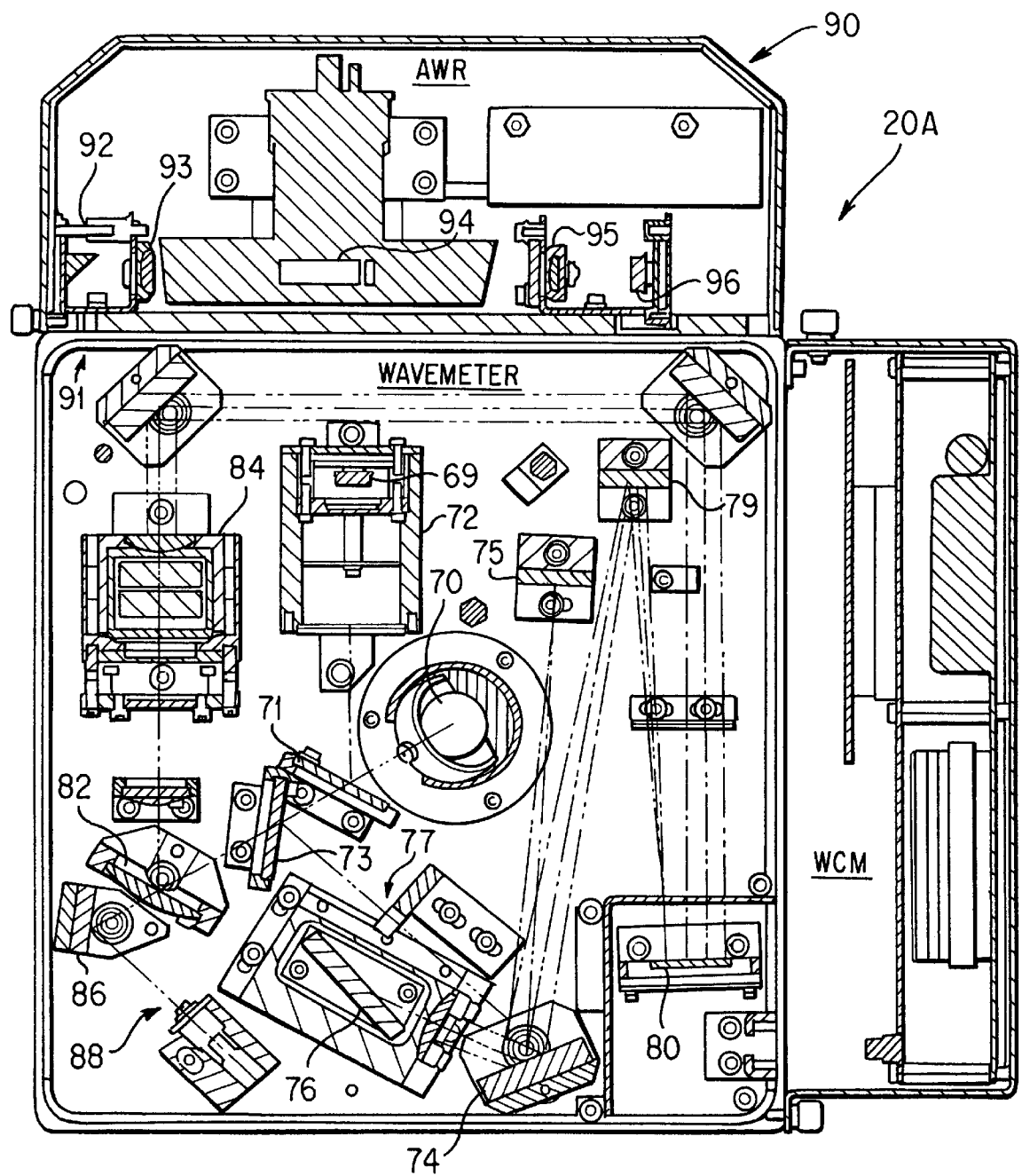
FIG. 10 is a drawing showing features of an improved wavemeter.

About 4% of the beam which passes through mirror 71 is reflected by mirror 73 through slit 77 to mirror 74, to mirror 75, back to mirror 74 and onto eschelle grating 76. The beam is columnated by lens 78 having a focal length of 458.4 mm. Light reflected from grating 76 passes back through lens 78, is reflected again from mirrors 74, 75 and 74 again and then is reflected from mirror 79 and focused onto the left side of linear photo diode array 80. The position of the beam on the photo diode array is a coarse measure of the relative nominal wavelength of the output beam. About 90% of the beam which passes through mirror 73 is reflected off mirror 82 through lens 83 into etalon 84 the beam exiting etalon 84 is focused by a 458.4 mm focal length lens in the etalon and produces interference fringes on the middle and right side of linear photo diode array 80 after being reflected off two mirrors as shown in FIG. 10.

The spectrometer must measure wavelength and bandwidth substantially in real time. Because the laser repetition rate may be 1 kH$_z$ or higher, it is necessary to use algorithms which are accurate but not computation intensive in order to achieve the desired performance with economical and compact processing electronics. This amounts to using integer as opposed to floating point math, and operations are all linear (or use of square root, sine, log, etc.).

Figure 11A:
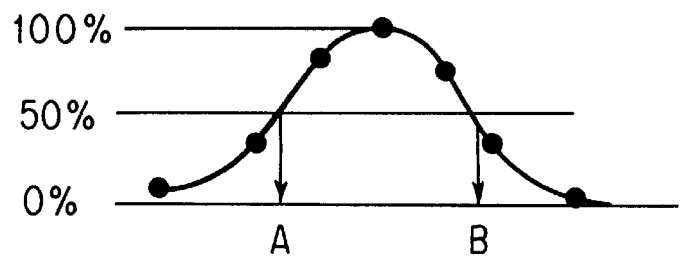
FIGS. 11A and 11B are graphs describing the functioning of the FIG. 10 wavemeter.
Figure 11B:
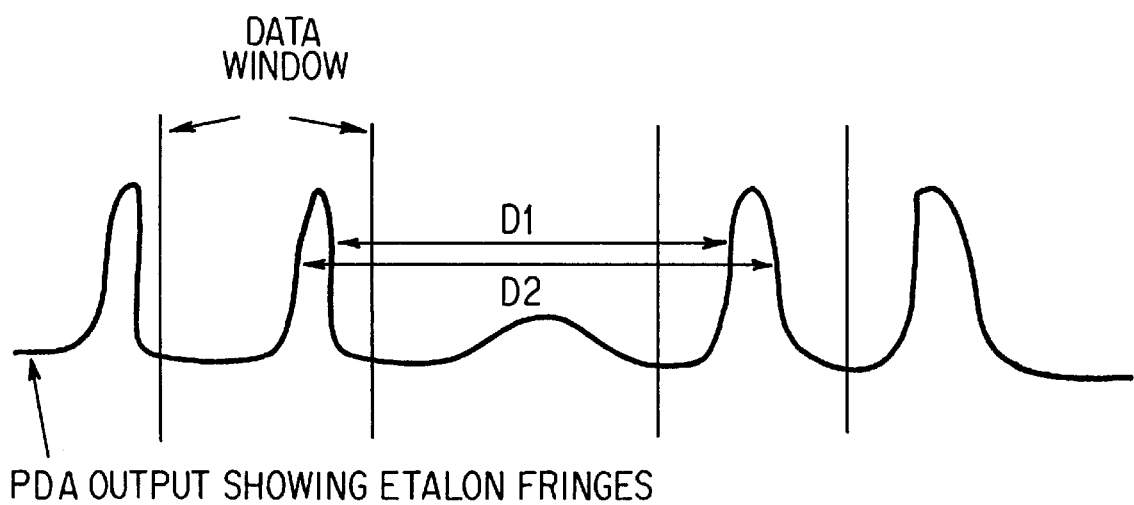
Figure 12A:
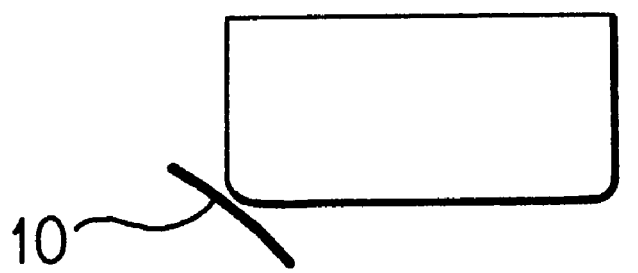
FIGS. 12A–12E show improved anode support bar designs to reduce aerodynamic reaction forces.
Figure 12B:
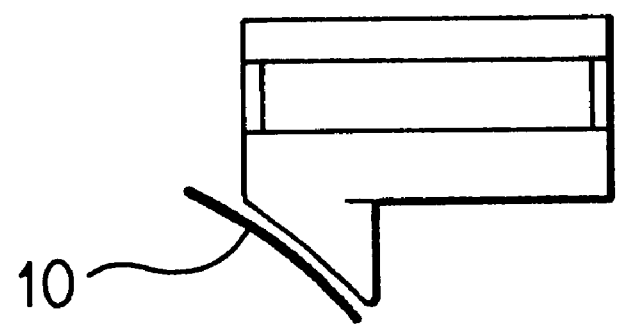
Figure 12C:
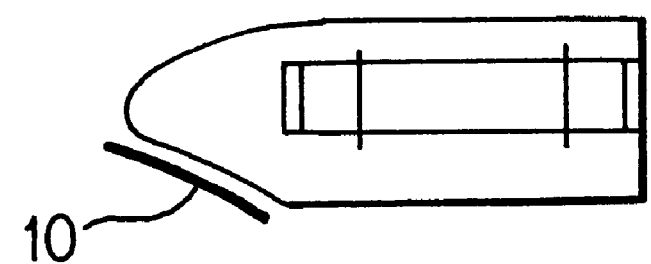
Figure 12D:
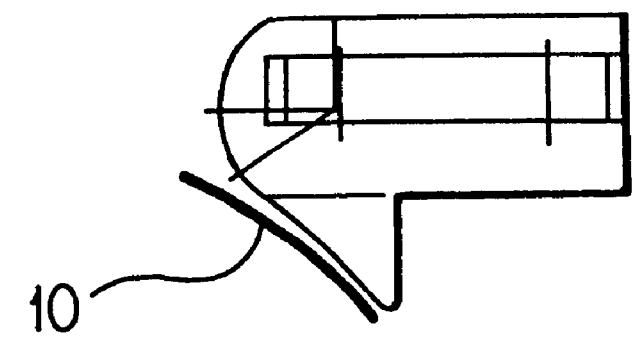
Figure 12E:
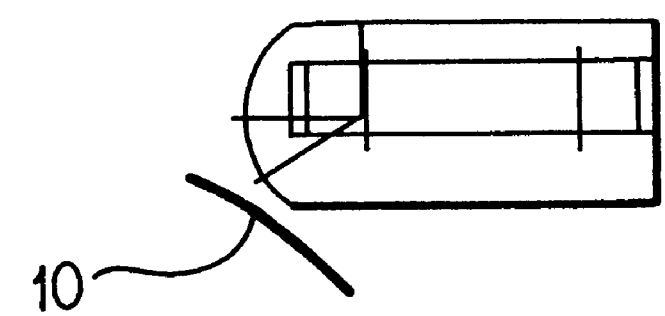

The specific details of the algorithm used in this preferred embodiment will now be described. FIG. 11B is a curve with 5 peaks is shown which represents a typical etalon fringe signal as measured by a linear photodiode array. The central peak is drawn lower in height than the others. As different wavelengths of light enter the talon, the central peak will rise and fall, sometimes going to zero. This aspect renders the central peak unsuitable for the present purpose. The other peaks will move toward or away from the central peak in response to changes in wavelength, so the position of these peaks determines the wavelength, while their width measures the bandwidth of the laser. A region labeled data window is shown in FIG. 11B. The data window is located so that the fringe nearest the central peak is normally used for the analysis. However, when the wavelength changes to move the fringe too close to the central peak (which will cause distortion and resulting errors), the second closest peak will be inside the data window, and the software will jump to that peak. Conversely, when the wavelength shifts to move the current peak outside the data window away from the central peak the software will jump to an inner fringe within the data window.

The steps involved are as follows:

1. After a laser shot, the photo diode array is electronically read out and digitized. Data points are separated by an interval physically determined by the spacing of the photo diode array elements, typically 25 microns.

2. The digital data is searched to find the peak value in the data window. The previous peak location is used as a starting point. Small regions are searched left and right of the starting point. The search region is extended by small intervals left and right until a peak is found. If the peak is outside the data window, the search will automatically continue until the other peak is found.

3. Based on the height of the peak, a 50% level is computed. This is shown at the top of the figure. The 0% level is measured periodically between the peaks. Based on the computed 50% level, points are examined right and left of the peak until the data points which border the 50% level are found. A linear interpolation is computed between pairs of points, which border the 50% level to find the left and right half-maximum positions, labeled A, and B in FIG. 11A. These positions are computed to a fraction of a pixel such as $\frac{1}{16}$, still using an integer data format.

4. Steps 2 and 3 are duplicated for the two data windows, giving a total of four interpolated 50% positions. As indicated FIG. 11B, two diameters are computed. D1 is the inner fringe diameter while D2 is the outer fringe diameter.

5. The D1 and D2 values (in pixel index units) are converted into wavelength by multiplying by an appropriate scale factor.

6. The bandwidth of the laser is computed as (D2−D1)/2. A linear correction factor is applied to account for the intrinsic width of the etalon peak adding to the true laser bandwidth. Mathematically, a deconvolution algorithm is the formalism for removing the intrinsic width from the measured width, but this would be far too computationally intensive, so a linear approximation is applied which provides sufficient accuracy.

7. The laser wavelength is computed as (D1+D2)/2 MOD 20, where MOD is the modulus operator and 20 is the free spectral range (FSR) of the etalon (spacing between peaks). The MOD operator is appropriate because the fringe pattern repeats every 20 pm, or whatever the FSR of the etalon in use.

8. To compute the absolute wavelength, a coarse wavelength measurement is also performed which is required only to have +/− 10 pm accuracy. For example, the coarse wavelength might be measured as 248.35 nm, while the etalon wavelength indication could be X.X5731, where X indicates digits that are indeterminate due to the modulus operation. Note that there is one digit that overlaps for both readings, a 5 in this case. Agreement of the overlapping digit for both coarse and etalon calculations is used to verify self-consistency.

About 10% of that portion of the beam that passes through mirror 82 are reflected from mirror 86 into fiber optic input 88 and the light travels through an optical fiber to atomic wavelength reference 90. The optical fiber connects to atomic reference unit 90 at opening 91, and the light from the optical fiber reflects off mirror 92 and is focused by lens 93 to a focal point in the center of neon iron vapor cell 94, and is focused again by lens 95 onto photodiode 96. Atomic wavelength reference unit 90 is used to calibrate wavemeter 20A. This is done by adjusting the wavelength of the laser while keeping the output energy constant as shown by detector 69 while monitoring the output of photodiode 96. When photodiode 96 shows a substantial reduction in output while photodiode 69 shows nominal output, the wavelength of the output must correspond to the iron vapor absorption line of 248.3271 nm. The position data corresponding to the etalon fringes and the position data corresponding to the image produced by grating 76 on linear photo diode 80 when the output of photo diode 96 is lowest is detected and recorded by computer controller 22 and this data are used by computer controller 22 to calibrate wavemeter 20A.

Pulse Energy Control Algorithm

Mode of Operation—Chip Lithography

The embodiment of the present invention includes a computer controller program with a new algorithm, which substantially reduces prior art variations in pulse energy and total integrated burst energy. The improved equipment and software and a preferred process for reducing energy sigma and burst dose variation is described below.

As stated in the background section of this specification, the burst mode is a typical mode of operation of an excimer laser used for the light source of a stepper machine in the lithographic production integrated circuits. In this mode the laser is operated to produce "a burst" of pulse at the rate of 1000 Hz for about 110 milliseconds to produce 110 pulses to illuminate a section of a wafer. After the burst the stepper moves the wafer and the mask and once the move is complete which takes typically a fraction of a second the laser produces another 110 pulse burst. Thus, normal operation is bursts of about 110 milliseconds followed by dead times of a fraction of a second. At various times, longer dead time periods will be provided so that other operations can be performed. This basic process continues 24 hours a day, 7 days per week, for several months with the laser typically producing several millions of bursts per day. In the above burst mode, it is usually important that each section of the wafer received the same illumination energy on each burst. Also, chip makers want the pulse to pulse variation to be minimized.

This preferred embodiment of the present invention accomplishes these objectives with equipment and software which monitors the energy of each pulse (pulse N−1) then controls the energy of the next pulse (pulse N) based on the results of a:

1) a comparison of the measured energy of pulse N−1 with a target pulse energy and 2) a comparison of the accumulated dose of the burst through pulse N−1 to a target pulse dose through pulse N−1.

In the typical KrF excimer laser we have been discussing the energy of the first 30–40 pulses is typically less stable than the rest of the burst due to transient effects in the laser gas. After about 40 ms following the first pulse, the pulse energy at constant voltage is relatively constant. In dealing with these early perturbations, Applicants have separated the burst into two time-wise regions, the first region (consisting of a number of the earlier pulses, for example, 40 pulses) called the "K" region and a second region (consisting of the pulses which follow the K region) which Applicants, in this specification, refer to as the "L" region.

Figure 1:
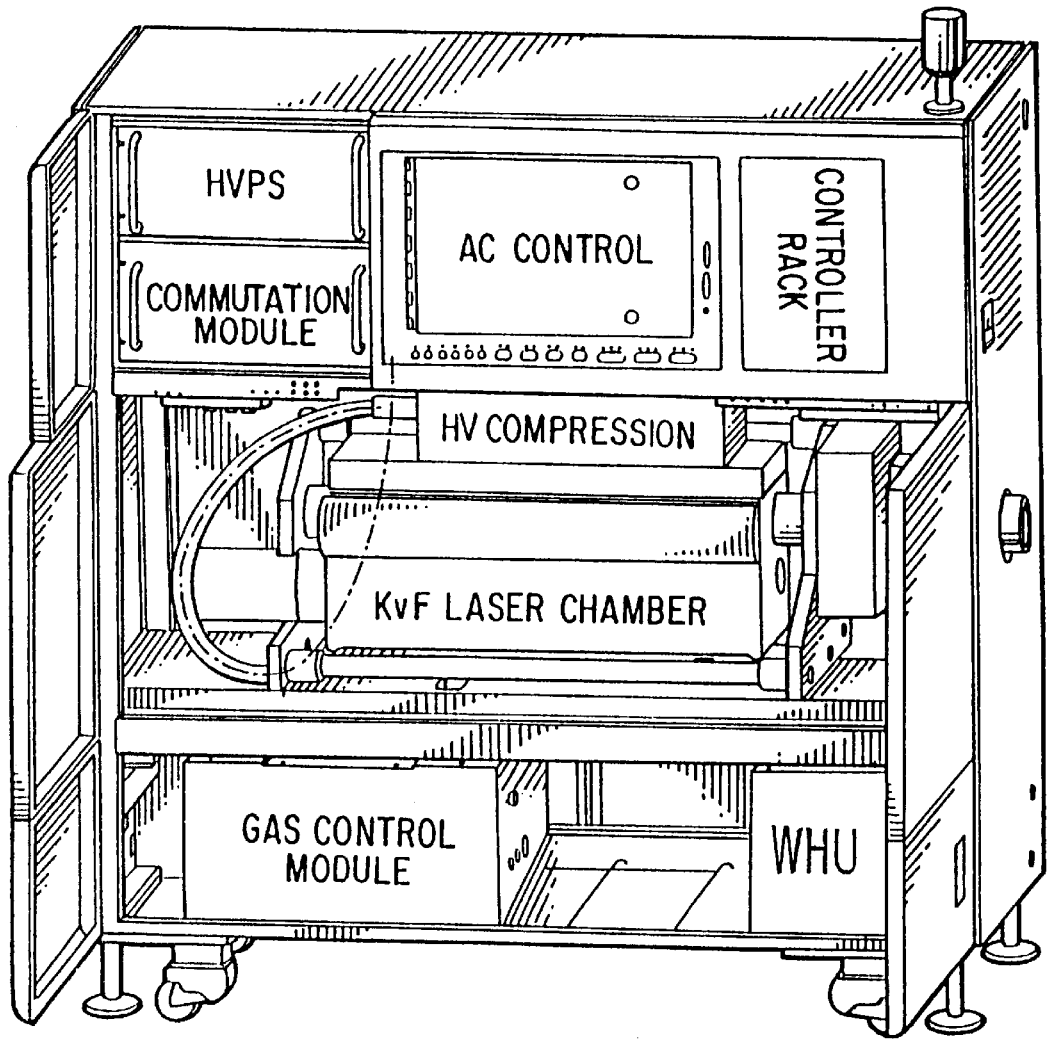
FIG. 1 is a drawing of a prior art commercial KrF lithography laser.
Figure 2:
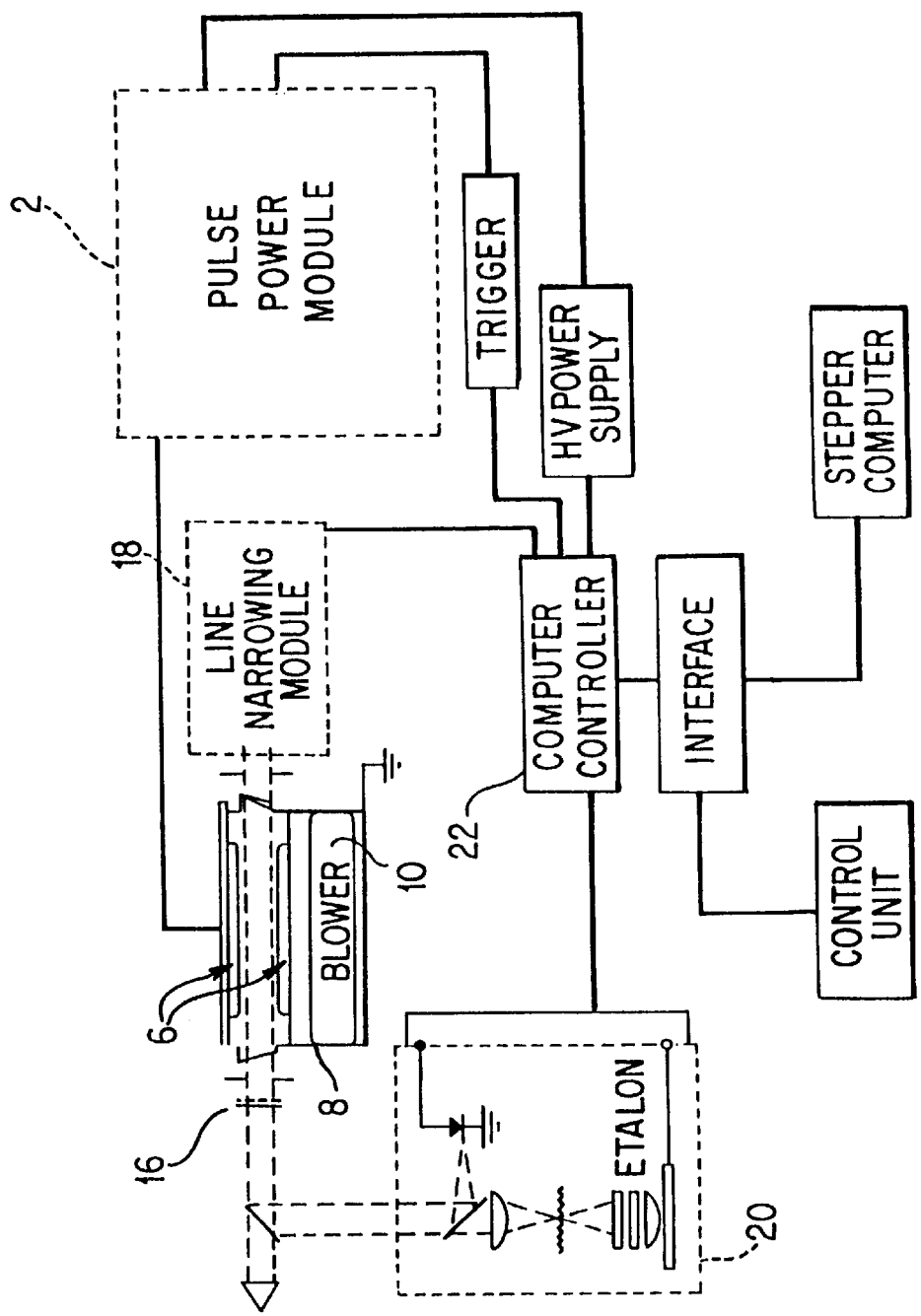
FIG. 2 is a drawing showing the principal elements of a prior art commercial KrF excimer lasers used for integrated circuit lithography.

This embodiment of the present invention utilizes prior art excimer laser equipment for pulse energy control. Pulse energy of each pulse of each burst is measured by photodiode 69 as shown in FIG. 10. The response time of this photodiode array is less than 1 millisecond. The accumulated signal resulting from each approximately 20 ns pulse is stored and this signal is read by computer controller 22 approximately 1.0 microsecond after the beginning of the pulse. The accumulated energy of all the previous individual pulses in a burst is referred to as the burst dose value. Computer controller utilizes the signal representing the pulse energy of pulse N along with target pulse energy and the burst dose value in order to specify the high voltage for the pulse N+1. This calculation requires about 200 microseconds. When the value of high voltage for N+1 is determined, computer controller sends a signal to the high voltage command (VCMD) 120 of the high voltage power supply as shown in FIG. 9 establishing the charging voltage for pulse N+1 that takes a few microseconds. Computer controller 22 commands the high voltage power supply to charge up capacitor Co to the specified voltage. (At high repetition rates it may be desirable to start the charging before the calculation is complete.) The charging requires about 400 microseconds so that Co is fully charged and ready to go when it receives a trigger signal for pulse N+1 from trigger circuit 13 as shown in FIG. 2 at 1.0 millisecond after the trigger signal from pulse N. On the trigger signal, capacitor Co discharges its approximately 650 volts into the magnetic compression circuit shown in FIG. 4 over a period of about 5 microseconds and the pulse is compressed and amplified by the magnetic compression circuit to produce a discharge voltage on capacitor Cp of about 16,000 volts which discharges across electrodes 6 in about 100 ns producing a laser pulse of about 10 mJ and about 75 ns (95% integral) in duration.

Preferred Algorithm

A special preferred process for adjusting the charging voltage to achieve substantially desired pulse energies when operating in a burst mode is described below.

The process utilizes two voltage adjustment algorithms. The first algorithm applies to the first 40 pulses and is called the KPI algorithm. The second algorithm called the PI algorithm applies to pulses after pulse number 40. This time period after the $40^{th}$ pulse is herein called the "L region" of the burst. The initials "PI" refer to "proportional integral" and the "K" in "KPI" refers to the "K region" of the burst.

KPI Algorithm

The K region comprises pulses 1 through k, where k=40 for this preferred embodiment. The algorithm for setting the charging voltage for pulse N is:

$$V_N = (V_B)_N - (V_C)_{N-1} \quad N=1,2,\ldots k$$

where:

$V_N$ = charging voltage for $N$'th pulse $(V_B)_N$ = an array of $k$ stored voltages which represents the current best estimate of the voltage required to produce the target energy $E_T$ for the $N$'th pulse in the $K$ region. This array is updated after each burst according to the equation below.

$(V_C)_{N-1}$ = a voltage correction based on the energy errors which occured for the previous pulses in the burst, up to pulse $N-1$ $$= \sum_{i=1}^{N-1} \frac{(A \cdot \varepsilon_i + B \cdot D_i)}{(dE/dV)}$$

By definition, $(V_C)_0 = 0$.

$A, B$ = fractions typically between 0 and 1, which in this preferred embodiment is 0.5

$\varepsilon_i$ = the energy error of the $i$'th pulse

= $E_i - E_T$, where $E_i$ is the energy for the $i$'th pulse, and $E_T$ is the target energy $D_i$ = the cumulative dose error of the burst, including all pulses from 1 through $i$ $$= \sum_{k=1}^{i} \varepsilon_k$$

$dE/dV$ = a rate of change of pulse energy with charging voltage. (In this embodiment, one or more values of $dE/dV$ is determined experimentally during each burst and a running average of these values is used for the calculation)

$$(V_B)_N^{M+1} = (V_B)_N^M - C \cdot \left( \frac{\varepsilon_N}{dE/dV} - (V_C)_N \right),$$

$$V_N = V_{N-1} - \frac{(A \cdot \varepsilon_{N-1} + B \cdot D_{N-1})}{(dE/dV)} \quad N = k+1, k+2, \ldots$$

where:

$V_n$=charging voltage for the N'th pulse $V_{N-1}$=charging voltage for N−1'st (previous) pulse The variables A, B, $\epsilon_1$, $D_1$, and dE/dV are defined as before.

Determination of dE/dV

A new value for dE/dV is determined periodically, in order to track the relatively slow changes in the characteristics of the laser. In the preferred embodiment, dE/dV is measured by varying or "dithering" the voltage in a controlled way during two successive pulses in the L region. For these two pulses, the normal PI energy control algorithm is temporarily suspended and replaced by the following:

For pulse j:

$$V_j = V_{j-1} - \frac{(A \cdot \varepsilon_{j-1} + B \cdot D_{j-1})}{(dE/dV)} + V_{Dither}$$

where $V_{Dither}$=a fixed voltage increment, typically a few volts

For pulse j+1:
$V_{j+1} = V_j - 2 \cdot V_{Dither}$

After pulse j+1, dE/dV is calculated:

$$dE/dV = \frac{(E_{j+1} - E_j)}{2 \cdot V_{Dither}}$$

The calculation of dE/dV can be very noisy, since the expected energy changes due to the dithering voltage can be of the same magnitude as the normal energy variation of the laser. In the preferred embodiment, a running average of the last 50 dE/dV calculations is actually used in the PI and KPI algorithms.

The preferred method for choosing $V_{Dither}$ is to specify a desired energy dither $E_{Dither}$, typically a few percent of the energy target $E_T$, and then use the current (averaged) value for dE/dV to calculate $V_{Dither}$:

$$V_{Dither} = \frac{E_{Dither}}{(dE/dV)}$$

Pulse j+2 (immediately following the two dithered pulses) is not dithered, but has the special value:

$$V_{j+2} = V_{j+1} + V_{Dither} - \frac{(A \cdot (\varepsilon_{j+1} + E_{Dither}) + B \cdot D_{j+1})}{(dE/dV)} \quad \text{(pulse } j+2\text{)}$$

This special value for $V_{j+2}$ is corrected for both the applied voltage dither and the expected energy dither from pulse j+1.

Many variations on the algorithm described above are possible. For example, dE/dV can be determined in the L region as well as the K. The dithering can be performed once per burst, or several times. The dithering sequence may be performed at a fixed pulse number j as described above, or it may be initiated for a randomly chosen pulse number which varies from one burst to the next.

The reader should recognize that A, B and C are convergence factors, which could have many other values. Higher values than those specified above could provide quicker convergence but could lead to increased instability. In another preferred embodiment, B is equal to the square root of A. This relationship is developed from a recognized technique to produce critical damping. B could be zero in which case there would be no dose correction; however, A should not be zero.

If the calculated value of dE/dV becomes too small the above algorithm could cause over correction. Therefore a preferred technique is to arbitrarily double dE/dV if the energy sigma value exceeds a threshold. Default values of V and dE/dV are provided for the first pulse of a burst. D is set to zero at the start of each burst. The default dE/dV is set at about three times the expected dE/dV to avoid initial over correction.

An alternate method of determining dE/dV without the dither referred to above is to merely measure and store the energy and voltage values during laser operation. (Specified rather than measured voltage values can also be used.) These data can be used to determine dE/dV as a function of V for constant pulse energy. The reader should note that each individual value of dE/dV will contain fairly large uncertainties because the elements of the value are differences of measurements having significant uncertainties. However, averaging large numbers of dE/dV values can reduce these uncertainties.

The dither exercise to determine ΔE does not have to be made on each burst but instead could be done periodically such as once every M bursts. Or the measurement of ΔE/ΔV could be replaced by a calculation performed by the computer or the value of ΔE/ΔV could be inserted manually by the operator of the laser. The method used to select the charging voltage operating range can differ from the method described above, and the operating range could be made smaller by injecting fluorine more frequently than about once per two hours. In fact, the operating range could be made very small by continuous injections of fluorine at the rate needed to match fluorine depletion. The values for $V_{N-1}$ are chosen from specified voltage values for the previous pulse for the calculation of $V_N$. An alternate approach would be to use the actual measured value for $V_{N-1}$ for this control system. Also the value of $V_{BIN}$ are calculated from specified values, not actual measured values in the above-described embodiment. An obvious alternative would be to use measured voltage values. $E_T$ is normally a constant value such as 10 mJ but it does not have to be constant. For example, $E_T$ of the last ten pulses could be smaller than the nominal pulse energy so that percentage deviations from target $E_T$ for these pulses would have a smaller effect on the integrated pulse dose. Also, it may be preferable in some situations to program computer controller 22 to provide $E_T$ values that vary from burst to burst.

Although this very narrow-band KrF excimer laser has been described with reference to a particular embodiment, it is to be appreciated that various adaptations and modifications may be made. For example, many alternative embodiments are discussed in the patent applications listed in the first sentence of this specification, all of which have been incorporated herein by reference. The invention is to be limited only by the appended claims.

We claim:

1. A very narrow-band KrF excimer laser comprising:
   A. a laser chamber containing:
      (1) two elongated electrodes;
      (2) a single preionizer tube;
      (3) laser gas defining a total pressure and comprised of krypton, fluorine and a buffer gas, said fluorine having a partial pressure of less than 0.08 of the total pressure;
      (4) at least two acoustic baffles positioned to attenuate shock waves produced by electric discharge between said two elongated electrodes;
   B. a line narrowing module comprised of:
      (1) at least one beam expanding prism;
      (2) a grating;
      (3) a tuning means for tuning the grating.

2. A laser as in claim 1 wherein said chamber also comprises a blower circulating said laser gas between said two elongated electrodes so as to define an upstream direction and said single preionizer tube is located upstream of said electrodes.

3. A laser as in claim 2 wherein two elongated electrodes define a cathode and an anode and said anode is supported by an anode support bar having a tapered surface positioned to reduce aerodynamic reaction forces on said bearings.

4. A laser as in claim 1 wherein said at least one prism is comprised of calcium fluoride.

5. A laser as in claim 1 wherein at least one prism is three prisms, all comprised of calcium fluoride.

6. A laser as in claim 1 wherein the partial pressure of fluorine is less than 0.06% of the total gas pressure.

7. A laser as in claim 1 and further comprising a high voltage power supply supplying high voltages across said electrodes, said high voltage power supply comprising:
   A. A pulse power supply having fine digital regulation and defining a charging cycle, said power supply comprising:
      (1) a first rectifier providing a direct current output,
      (2) an inverter for converting the output of said first rectifier to high frequency first alternating current at a first alternating current voltage,
      (3) a step up transformer for amplifying the output voltage of said inverter to provide a second alternating current at a second alternating current voltage,
      (4) an second rectifier for rectifying said second alternating current voltage,
      (5) a control board comprising electronic circuits to control said power supply to provide high voltage pulses at a frequency of at least about 1000 $H_z$,
      (6) a voltage feedback circuit comprising a voltage detection circuit for detecting the voltage output of said second rectifier and providing a voltage output signal to said control board,
      (7) a current feedback circuit comprising a current detection circuit for detecting charging current flowing from said second rectifier and providing a charging current signal to said control board,
      (8) a digital command control for providing command control to said control board; and
   B. a magnetic switch for compressing and amplifying output electrical pulses from said pulse power supply.

8. An excimer laser as in claim 7 wherein said voltage feedback circuit comprises a differential instrumentation amplifier.

9. An excimer laser as in claim 7 wherein said current feedback circuit comprises a differential instrumentation amplifier.

10. An excimer laser as in claim 7 wherein said second alternating current defines a resonant frequency and further comprising a resistor circuit and a switch means for forcing said charging current through said resistor circuit in order to decrease the resonant frequency near the end of each charging cycle.

11. A laser as in claim 1 and further comprising an output coupler having a reflectance of at least about 20%.

12. A laser as in claim 1 and further comprising a wavemeter, said wavemeter comprising a grating band wavelength monitor providing a coarse measurement of wavelength and an etalon-based wavelength monitor being aligned to focus an optical indication of relative wavelength at a first location on a diode array and said etalon-based wavelength monitor being aligned to focus an optical wavelength a location on said diode different from said first location.

13. A laser as in claim 12 and further comprising an atomic reference unit for calibrating said grating-based wavelength monitor and said etalon-based wavelength monitor.

14. A laser as in claim 1 and further comprising a means of measuring the rate of change of pulse energy with charging voltage ΔE/ΔV, and a computer controller programmed with an algorithm for controlling pulse energy and integrated energy dose in a burst of pulses defining present burst pulses, $P_1, P_2 \ldots P_N \ldots P_K, P_{K+1}, P_{K+2} \ldots P_{K+N1} \ldots P_1, P_2 \ldots P_{N-1}, P_N$, from said laser having a pulse power system including a high voltage charging system defining a charging voltage, said algorithm comprising the steps of:

(1) determining for each $P_N$ a pulse energy error, $\epsilon$, based on a measured energy of at least one previous pulse in said burst and a predetermined target pulse energy value, (2) determining for each $P_N$ an integrated dose error, D, of all previous pulses, $P_1$ through $P_{N1}$, in said burst, (3) determining a charging voltage, $V_N$, for each of said pulses, $P_N$, in said first plurality of pulses using:
  (i) said $\Delta E/\Delta V$
  (ii) said $\epsilon$
  (iii) said D
  (iv) a reference voltage based on specified voltages for $P_N$ in a plurality of previous bursts, C. controlling the pulse energy of each pulse $P_{K+N}$ in pulse following $P_K$ in said burst of pulses by regulating the charging voltage of the laser utilizing a computer processor programmed with an algorithm which:

(1) determining for each $P_N$ a pulse energy error, $\epsilon$, based on a measured energy of at least one previous pulse in said burst and a predetermined target pulse energy value, (2) determining for each $P_N$ an integrated dose error, D, of all previous pulses, $P_1$ through $P_{N1}$, in said burst, (3) determining a charging voltage, $P_N$, for each of said pulses, $P_N$, in said first plurality of pulses using:
  (i) said $\Delta E/\Delta V$
  (ii) said $\epsilon$
  (iii) said D
  (iv) a reference voltage based on specified voltages for $P_N$ in a plurality of previous bursts.

15. A laser as in claim 1 and further comprising an anode support means comprising a tapered surface for reducing the magnitude of aerodynamic reaction forces resulting from laser gas exiting said blower and being redirected by said anode support means.

16. A laser as in claim 1 wherein said fluorine defines a partial pressure which is less than about 0.08 of the total pressure.

* * * * *